(12) United States Patent
Duvvury et al.

(10) Patent No.: US 6,781,204 B1
(45) Date of Patent: Aug. 24, 2004

(54) SPREADING THE POWER DISSIPATION IN MOS TRANSISTORS FOR IMPROVED ESD PROTECTION

(75) Inventors: Charvaka Duvvury, Plano, TX (US); Kwang-Hoon Oh, Seoul (KR)

(73) Assignee: Texas Instruments Incorporated, Dallas, TX (US)

( * ) Notice: Subject to any disclaimer, the term of this patent is extended or adjusted under 35 U.S.C. 154(b) by 33 days.

(21) Appl. No.: 10/388,945

(22) Filed: Mar. 13, 2003

(51) Int. Cl.⁷ .......................... H01L 27/01; H01L 27/12; H01L 31/0392
(52) U.S. Cl. .......................... 257/353; 257/354; 257/360
(58) Field of Search .................................. 257/353, 354, 257/360, 173

(56) References Cited

U.S. PATENT DOCUMENTS 5,404,041 A  *  4/1995  Diaz et al. ................... 257/360
6,621,133 B1 *  9/2003  Chen et al. .................. 257/409

* cited by examiner

Primary Examiner—Thien F Tran
(74) Attorney, Agent, or Firm—W. James Brady, III; Frederick J. Telecky, Jr.

(57) ABSTRACT

An MOS transistor in the surface of a semiconductor substrate (180) of a first conductivity type, which has a grid of isolations (171) in the surface, each grid unit surrounding a rectangular substrate island (102). Each island contains two parallel regions of the opposite conductivity type: one region (174) is operable as the transistor drain and the other region (173) is operable as the transistor drain, each region abutting the isolation. A transistor gate (105) is between the parallel regions, completing the formation of a transistor. Electrical contacts (106) are placed on the source region (173) so that the spacing (120) between each contact and the adjacent isolation is at least twice as large as the spacing (121) between each contact and the gate. A plurality of these islands are interconnected to form a multi-finger MOS transistor. The source contact spacings are selected to increase the failure threshold current of the multi-finger MOS transistor by spreading the power dissipation and thus reducing the current localization, whereby the protection of the transistor against ESD pulses is improved.

9 Claims, 2 Drawing Sheets

SPREADING THE POWER DISSIPATION IN MOS TRANSISTORS FOR IMPROVED ESD PROTECTION

The present filing is related to filing TI-35840 "Geometry-Controllable Design Blocks of MOS Transistors for Improved ESD Protection".

1. Field of the Invention

The present invention is related in general to the field of electronic systems and semiconductor devices and more specifically to the layout of multi-finger MOS transistors aiming at ESD protection.

2. Description of the Related Art

Integrated circuits (ICs) may be severely damaged by electrostatic discharge (ESD) events. A major source of ESD exposure to ICs is from the human body (described by the "Human Body Model", HBM); the discharge of the human body generates peak currents of several amperes to the IC for about 100 ns. A second source of ESD is from metallic objects (described by the Machine model", MM); it can generate transients with significantly higher rise times and current levels than the HBM ESD source. A third source is described by the "charged device model" (CDM), in which the IC itself becomes charged and discharges to ground in rise times less than 500 ps.

ESD phenomena in ICs are growing in importance as the demand for higher operating speed, smaller operating voltages, higher packing density and reduced cost drives a reduction of all device dimensions. This generally implies thinner dielectric layers, higher doping levels with more abrupt doping transitions, and higher electric fields—all factors that contribute to an increased sensitivity to damaging ESD events.

The most common protection schemes used in metal-oxide-semiconductor (MOS) ICs rely on the parasitic bipolar transistor associated with an nMOS device whose drain is connected to the pin to be protected and whose source is tied to ground. The protection level or failure threshold can be set by varying the nMOS device width from the drain to the source under the gate oxide of the nMOS device. Under stress conditions, the dominant current conduction path between the protected pin and ground involves the parasitic bipolar transistor of that nMOS device. This parasitic bipolar transistor operates in the snapback region under pin positive with respect to ground stress events.

The dominant failure mechanism, found in the nMOS protection device operating as a parasitic bipolar transistor in snapback conditions, is the onset of second breakdown. Second breakdown is a phenomenon that induces thermal runaway in the device wherever the reduction of the impact ionization current is offset by the thermal generation of carriers. Second breakdown is initiated in a device under stress as a result of self-heating. The peak nMOS device temperature, at which second breakdown is initiated, is known to increase with the stress current level.

It is well known that for non-silicided or silicide-blocked nMOS transistors, the second breakdown trigger current (It2), which is widely used as an ESD strength monitor, can be increased with larger drain contact spacings because of more uniform triggering of the lateral npn structure, due to ballast resistance effects. In addition, it is also well established that effectiveness is much reduced in the case of devices with silicided diffusions, since the ballast resistance is insufficient, making the devices susceptible to current localization, which leads to early ESD failure. In silicided cMOS devices, the primary cause of the degradation of ESD failure threshold is known to be non-uniform bipolar conduction, which is attributed to insufficient ballasting resistance in the fully silicided source/drain structures. This decrease in ESD strength imposes severe restrictions on the efficient design of ESD protection. Known options for correcting this shortcoming either require an extra mask or more process complexity, resulting in increased process cost and chip real estate.

An urgent need has therefore arisen for cost effective design methods to achieve advanced ESD protection, compatible with uniform turn-on, high response speed, low capacitance and low leakage current using standard CMOS processing. The device structures should further provide excellent electrical performance, mechanical stability and high reliability. The fabrication method should be simple, yet flexible enough for different semiconductor product families and a wide spectrum of design and process variations. Preferably, these innovations should be accomplished without extending production cycle time, and using the installed equipment, so that no investment in new manufacturing machines is needed.

SUMMARY OF THE INVENTION

One embodiment of the invention is an MOS transistor in the surface of a semiconductor substrate of a first conductivity type, which has a grid of isolations in the surface, each grid unit surrounding a rectangular substrate island. Each island contains two parallel regions of the opposite conductivity type: one region is operable as the transistor drain and the other region is operable as the transistor drain, each region abutting the isolation. A transistor gate is between the parallel regions, completing the formation of a transistor. Electrical contacts are placed on the source region so that the spacing between each contact and the adjacent isolation is at least twice as large as the spacing between each contact and the gate. A plurality of these islands is interconnected to form a multi-finger MOS transistor. The source contact spacings are selected to increase the failure threshold current of the multi-finger MOS transistor by spreading the power dissipation and thus reducing the current localization, whereby the protection of the transistor against ESD pulses is improved.

Another embodiment of the invention has also the drain contacts placed so that the spacing between each contact and the adjacent isolation is at least twice as large as the spacing between each contact and the gate.

Embodiments of the present invention are related to advanced deep submicron technology devices with shallow trench isolation, especially salicided nMOS transistors. Such transistors are for instance employed in wireless devices, or in Application Specific products, or in mixed signal and logic devices.

A technical advantage of the invention is its simplicity so that it can easily be adopted into any integrated circuit design methodology.

Another technical advantage of the invention is that it may be implemented using standard semiconductor processing techniques. For ESD protection circuitry, as well as for general equalization needs, no additional processing time or expense to the integrated circuit is needed.

The technical advances represented by the invention, as well as the aspects thereof, will become apparent from the following description of the preferred embodiments of the invention, when considered in conjunction with the accompanying drawings and the novel features set forth in the appended claims.

BRIEF DECRIPTION OF THE DRAWINGS

DETAILED DESCRIPTION OF THE PREFERRED EMBODIMENTS

For silicided technologies, contact-to-gate spacing does not increase the ballast resistance and hence does not improve the ESD robustness for nMOS protection designs. However, for advanced deep submicron technologies, it has been found (Kwang-Hoon Oh, Charvaka Duvvury, Kaustav Banerjee and Robert. W. Dutton, "Investigation of Gate to Contact Spacing Effect on ESD Robustness of Salicided Deep Submicron Single Finger nMOS Transistors", Proc. Int. Reliability Physics Symp., pp. 148–157, 2002) that source and drain contact to gate spacing improves It2. The mechanism responsible for this improvement is decreased current crowding and improved heat-dissipating volume. Spacing to shallow trench isolation gives an additional boost to It2.

Figure 1A:
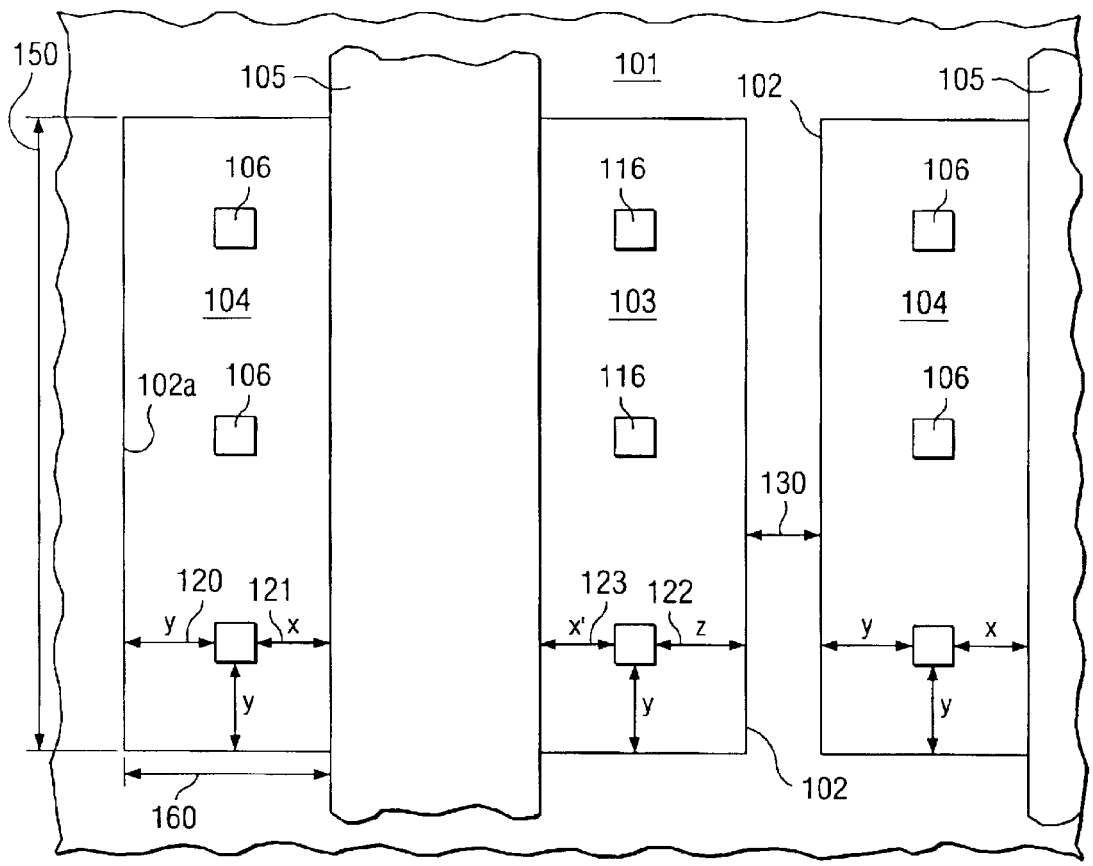
FIG. 1A is a schematic and simplified top view of an embodiment of the invention depicting a transistor segment placed in an island formed by insulators.

FIG. 1A illustrates a schematic top view of an embodiment of the invention. On the surface of a semiconductor substrate of a first conductivity type is an insulator 101 laid out so that the insulator surrounds rectangular openings 102. The conductivity type of the substrate can be n-type or p-type; the insulator may be a shallow trench isolation or some other field isolation. The openings are islands in which semiconductor material, forming a transistor, is exposed. Each island contains two parallel regions 103 and 104 of the opposite conductivity type. The region 103 is operable as the transistor drain, the region 104 is operable as the transistor source. Both regions 103 and 104 are abutting insulator 101. As shown in more detail in FIG. 1B, each region is silicided.

FIG. 1A indicates that between the parallel regions of source 104 and drain 103 is the transistor gate 105. A plurality of electrical contacts 106 is placed the source region 104 and contacts 116 on the drain region 114. FIG. 1A illustrates three contacts 106 per source region, and three contact 116 per drain region.

Each island provides improved It2 characteristics due to decreased current crowding and improved volume for thermal heating. Further, the layout of FIG. 1A may provide a plurality of islands 102 with a common bus line for all source regions and a common bus line for all drain regions (bus lines not shown in FIG. 1A). The plurality of islands is thus interconnected to form a finger-shaped MOS transistor with overall improved It2 characteristics. As an example of a particular layout, the distance 130 between adjacent islands is kept small (less than 1 μm, for instance 0.2 μm).

An additional significant boost to failure threshold current It2 can be obtained by an embodiment of the invention wherein the spacings 120 between the source contacts 106 and the respective island walls 102a of the insulator 101 are selected to be at least twice as large as the spacings 121 between each contact 106 and the gate 105. According to the invention, the source contact to insulator spacing 120 can be selected to increase It2, since this spacing 120 enables spreading of the power dissipation and thus reduces the current localization. It should be stressed that dimension 120 has no impact on the drain-to-substrate capacitance. The spacing 121 of source contact 106 to gate 105 is kept at about two times the minimum for the device design rule.

Referring to the drain region 103, the spacings 123 of drain contact 116 to gate 105 are kept small or, preferably, at about two times the minimum for the device design rules. In the latter case, spacings 123 are equal to spacings 121 in the source region. The spacings 122 of drain contact 116 to insulator 101 are either kept equal to spacings 123 or, in another embodiment, equal to spacings 121.

Examples of design dimensions in the 0.13 μm technology for transistor embodiments for ESD protection are preferably as follows. The width 150 of the opening 102 is 20 μm. In the source region, the contact spacing 120 from the insulator wall 102a is 1.0 μm, while the contact spacing 121 from the gate 105 is 0.5 μm (in contrast, for regular transistors, spacings 120 and 121 would be 0.1 μm). In the drain region, the contact spacing 122 from the insulator wall is 0.2 μm, while the contact spacing 121 from the gate is 0.5 μm (in contrast, for regular transistors, spacings 121 and 122 would be 0.1 μm).

Figure 1B:
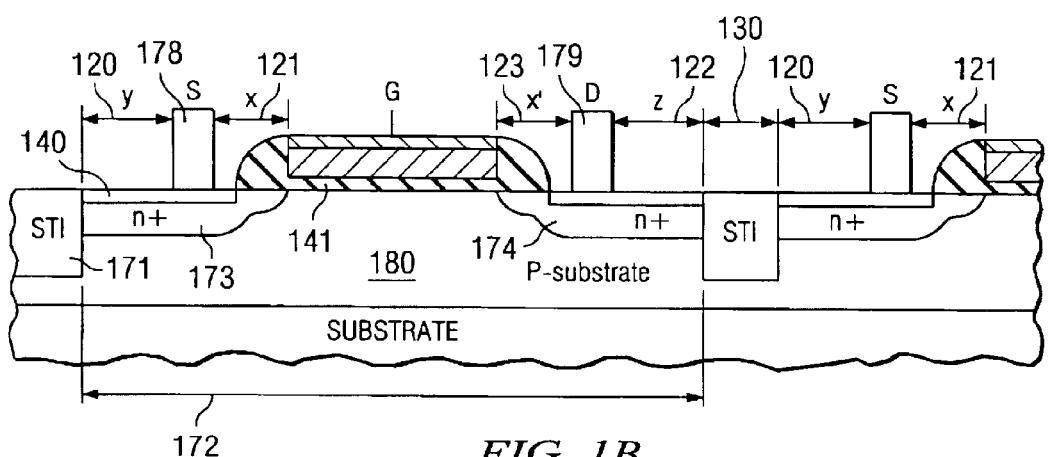
FIG. 1B illustrates a schematic cross section of the transistor island and circuitry of the embodiment depicted in FIG. 1A.

FIG. 1B shows a schematic cross section of the insulator grid 171 and the plurality of transistor islands 172 of the embodiment corresponding to the top view of FIG. 1A. In the design example of FIG. 1B, the semiconductor substrate 180 of the first conductivity type is p-type, and the source region 173 and the drain region 174 in each island are n+ type. As indicated in FIG. 1B, the source and drain regions (and gates) are silicided with layer 140 (for example, CoSi2). Furthermore, FIG. 1B shows the gate oxide layers 141, preferably 2.7 nm thick for 1.5 V, nMOS transistors, and 7.0 nm thick for 3.3 V nMOS transistors. As depicted in FIG. 1B, source contacts 178 have a spacing 120 from the adjacent insulator wall, which is larger than the contact-to-gate spacing 121. In the preferred embodiment, spacing 120 is at least twice as large as spacing 121. Spacing 121 (and the drain contact to gate spacings) are kept at about two times the minimum for the device design rule. Spacing 122 of the drain contact 179 to the adjacent insulator wall may be smaller than spacing 121.

A plurality of islands 102 can be interconnected to form a multi-finger MOS transistor with improved protection against an ESD pulse.

In another embodiment of the invention, the contacts 116 to the drain region 103 are also designed so that the spacing 122 between the contacts and the adjacent wall of the isolation 101 is at least twice as large as the spacing 121 between the source contacts 106 and the gate 105, or in other words, at least 4 times the design rule. This embodiment provides further improved It2 characteristics due to an additional decrease of the current crowding and a further improved volume for thermal dissipation.

It should be stressed that the concepts of these embodiments are applicable to any MOS (n type or p type) protection device for input pins, output pins, or power pins (Vdd), as well as to self-protection of output devices.

Figure 2:
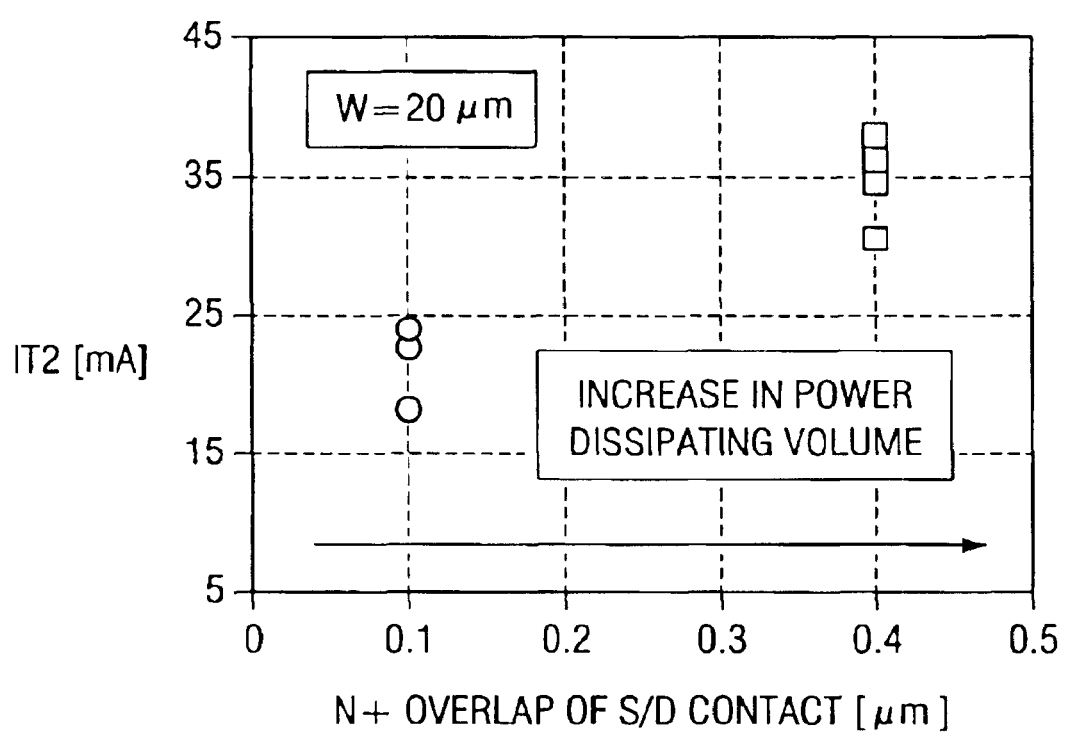
FIG. 2 is a plot of experimental data illustrating the second breakdown trigger current It2 as a function of the source and drain contact spacing to the respective insulator.

FIG. 2 plots the second breakdown triggering current It2, measured in mA, as a function of the spacing of the source contact to the adjacent insulator wall, measured in μm (in FIGS. 1A and 1B, this spacing is designated 120). As can be seen, an increase of this source contact-to-insulator spacing from 0.1 to 0.4 μm pushes the second breakdown trigger current from less than 25 mA to about 35 mA, almost twice its value. The reason for this improved ESD protection is an increase of the size of the power dissipating volume, or a spreading of the power dissipation.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the embodiments are effective in pMOS transistors as well as in nMOS transistors to create ESD protection. As another example, the substrate material may include silicon, silicon germanium, gallium arsenide and other semiconductor materials employed in manufacturing. As yet another example, the concept of the invention is effective for many semiconductor device technology nodes and not restricted to a particular one. It is therefore intended that the appended claims encompass any such modifications or embodiments.

We claim:

1. An MOS transistor in the surface of a semiconductor substrate of a first conductivity type, comprising:
    a grid of isolations in said surface, each grid unit surrounding a rectangular substrate island;
    each island containing two parallel regions of the opposite conductivity type, one of said regions operable as the transistor source and the other region operable as the transistor drain, each region abutting said isolations;
    a transistor gate between said parallel regions, completing the formation of a transistor;
    electrical contacts placed on said source region so that the spacing between each contact and the adjacent isolation is at least twice as large as the spacing between each contact and said gate; and
    a plurality of said islands interconnected to form a multi-finger MOS transistor.

2. The transistor according to claim 1 wherein said isolation is a shallow trench isolation or some other field isolation.

3. The transistor according to claim 1 wherein the surface of said regions of opposite conductivity type is silicided.

4. The transistor according to claim 1 wherein said first conductivity type of said semiconductor substrate is p-type.

5. The transistor according to claim 1 wherein said first conductivity type of said semiconductor substrate is n-type.

6. The transistor according to claim 1 further having each of said drain contacts placed so that the spacing between each contact and the adjacent isolation is at least twice as large as the spacing between each contact and said gate.

7. The transistor according to claim 6 wherein said spacings are selected to increase the failure threshold current of said multi-finger MOS transistor by spreading the power dissipation and thus reducing the current localization, whereby the protection of said transistor against ESD pulses is improved.

8. The transistor according to claim 6 wherein said spacings are selected to provide an efficient multi-finger output MOS transistor that can self-protect.

9. The transistor according to claim 6 wherein said source contact and said drain contact form minimum spacings to said gate.

* * * * *